US010141467B2

(12) United States Patent
Hwang et al.

(10) Patent No.: US 10,141,467 B2
(45) Date of Patent: Nov. 27, 2018

(54) SOLAR CELL AND METHOD FOR MANUFACTURING THE SAME

(71) Applicant: LG ELECTRONICS INC., Seoul (KR)

(72) Inventors: Sunghyun Hwang, Seoul (KR); Daeyong Lee, Seoul (KR); Jinsung Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 261 days.

(21) Appl. No.: 14/289,150

(22) Filed: May 28, 2014

(65) Prior Publication Data

US 2014/0352770 A1 Dec. 4, 2014

(30) Foreign Application Priority Data

May 28, 2013 (KR) .......................... 10-2013-0060556

(51) Int. Cl.
*H01L 31/00* (2006.01)
*H01L 31/068* (2012.01)
*H01L 31/0224* (2006.01)
*H01L 31/18* (2006.01)

(52) U.S. Cl.
CPC .... *H01L 31/068* (2013.01); *H01L 31/022433* (2013.01); *H01L 31/1804* (2013.01); *Y02E 10/547* (2013.01); *Y02P 70/521* (2015.11)

(58) Field of Classification Search
CPC ..... H01L 31/065; H01L 31/068; H01L 31/18; H01L 31/022433; H01L 31/1804
USPC ......................................................... 136/255
See application file for complete search history.

(56) References Cited

U.S. PATENT DOCUMENTS 6,133,119 A * 10/2000 Yamazaki ........... H01L 21/2022
257/E21.133
2006/0283499 A1* 12/2006 Terakawa ........ H01L 31/022466
136/258

* cited by examiner

*Primary Examiner* — Tamir Ayad
(74) *Attorney, Agent, or Firm* — Birch, Stewart, Kolasch & Birch, LLP

(57) ABSTRACT

Discussed is a solar cell including a semiconductor substrate, a first conductive type region formed on a surface of the semiconductor substrate, a second conductive type region formed on the other surface of the semiconductor substrate, the second conductive type region being spaced from an edge of the semiconductor substrate and having a conductive type different from that of the first conductive type region, an isolation portion formed at a perimeter of the second conductive type region on the other surface of the semiconductor substrate, a first electrode connected to the first conductive type region, and a second electrode connected to the second conductive type region, wherein the second conductive type region has a boundary portion in a part adjacent to the isolation portion, and in which a doping concentration or a junction depth varies over a width of the boundary portion.

12 Claims, 16 Drawing Sheets

ST10

ST24

ST30

SOLAR CELL AND METHOD FOR MANUFACTURING THE SAME

CROSS-REFERENCE TO RELATED APPLICATION

This application claims the priority benefit of Korean Patent Application No. 10-2013-0060556, filed on May 28, 2013 in the Korean Intellectual Property Office, the disclosure of which is incorporated herein by reference.

BACKGROUND OF THE INVENTION

1. Field of the Invention

The embodiments of the invention relate to a solar cell and a method for manufacturing the same and, more particularly, to a solar cell having an improved structure and a method for manufacturing the same.

2. Description of the Related Art

In recent years, as conventional energy resources such as petroleum and coal are expected to be depleted, interest in alternative energy resources to replace these energy resources is on the rise. Of these, solar cells are attracting considerable attention as next generation cells which convert solar energy into electrical energy.

Such a solar cell may be manufactured by forming conductive type regions and electrodes electrically connected thereto on a semiconductor substrate in order to enable photoelectric conversion. In addition, the solar cell may include a passivation film for passivating a conductive type region, an anti-reflective film for preventing reflection and the like in order to improve properties of solar cells.

In this regard, in the production of conductive type regions having different conductive types, conductive type regions which are electrically connected to each other also physically contact each other, thus causing unnecessary short-circuit. As a result, reliability of solar cells may be deteriorated. To prevent such deterioration in reliability, conductive type regions are formed and an isolation portion is then separately formed on the front surface of a semiconductor substrate by irradiation with a laser or by etching. However, this method involves an additional manufacturing process, thus causing deterioration in productivity, and reducing an effective area due to the isolation portion formed on the front surface of the semiconductor substrate and resulting in deterioration in efficiency of the solar cells.

SUMMARY OF THE INVENTION

It is an object of the invention to provide a solar cell with improved reliability and productivity, and high efficiency and a method for manufacturing the same.

In accordance with one aspect of the invention, the above and other objects can be accomplished by the provision of a solar cell including a semiconductor substrate, a first conductive type region formed on a surface of the semiconductor substrate, a second conductive type region formed on the other surface of the semiconductor substrate, the second conductive type region being spaced from an edge of the semiconductor substrate and having a conductive type different from that of the first conductive type region, an isolation portion formed at a perimeter of the second conductive type region on the other surface of the semiconductor substrate, a first electrode connected to the first conductive type region, and a second electrode connected to the second conductive type region, wherein the second conductive type region has a boundary portion in a part adjacent to the isolation portion in the semiconductor substrate, and in which a doping concentration or a junction depth varies over a width of the boundary portion.

In accordance with another aspect of the invention, provided is a method for manufacturing a solar cell including preparing a semiconductor substrate having a first conductive type, forming a conductive type region on at least one surface of the semiconductor substrate, and forming an electrode connected to the conductive type region, wherein the forming of the conductive type region includes forming a first conductive type region and a second conductive type region having different conductive types in the semiconductor substrate, and the forming of the second conductive type region includes ion-implanting a dopant while placing a mask covering at least an edge of the semiconductor substrate on the semiconductor substrate to form an isolation portion in the semiconductor substrate, and in which the dopant is not doped in a region covered by the mask.

In the embodiment of the invention, by forming a back electric field region using a mask, an isolation portion can be formed along the edge of the semiconductor substrate without adding a further process during the formation of the back electric field region. As a result, a further process of isolating the emitter region from the back electric field region is unnecessary and reverse current caused by connection of the back electric field region to the isolation portion is efficiently prevented. That is, solar cells with superior properties are manufactured at high productivity.

The effective area of the emitter region greatly affecting photoelectric transformation can be maximized by forming the isolation portion on the back surface of the semiconductor substrate provided with the back electric field region. As a result, photoelectric transformation is the most efficiently performed and generation of reverse current is prevented by the isolation portion.

BRIEF DESCRIPTION OF THE DRAWINGS

The above and other objects, features and other advantages of the invention will be more clearly understood from the following detailed description taken in conjunction with the accompanying drawings, in which.

DETAILED DESCRIPTION OF EMBODIMENTS

Figure 1:
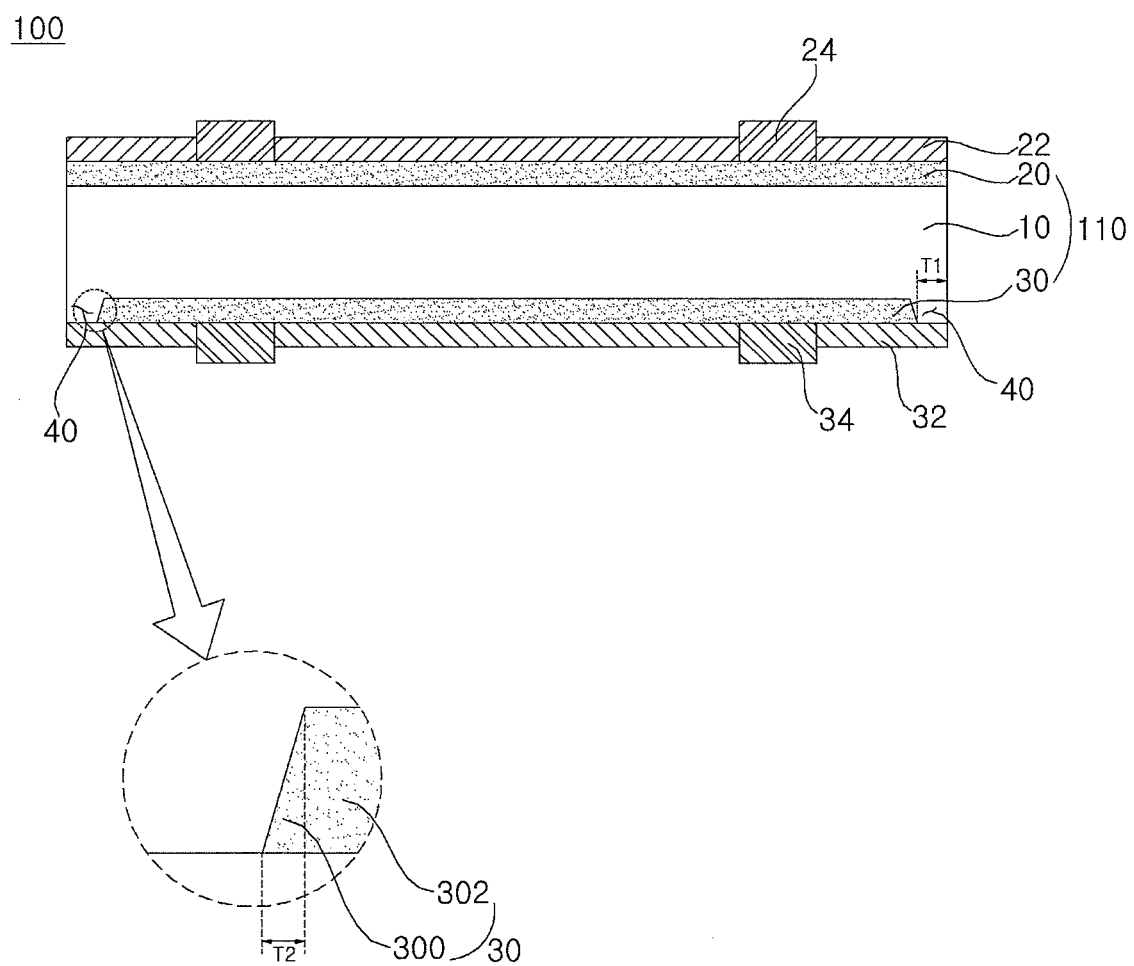
FIG. 1 is a sectional view illustrating a solar cell according to an embodiment of the invention.

Reference will now be made in detail to the embodiments of the invention, examples of which are illustrated in the accompanying drawings. The invention is not limited to the embodiments and the embodiments may be modified into various forms.

In the drawings, parts unrelated to the description are not illustrated for clear and brief description of the invention, and the same reference numbers will be used throughout the specification to refer to the same or considerably similar parts. In the drawings, the thickness or size may be exaggerated or reduced for clearer description. In addition, the size or area of each constituent element is not limited to that illustrated in the drawings.

It will be further understood that, throughout this specification, when one element is referred to as "comprising" another element, the term "comprising" specifies the presence of another element but does not preclude the presence of other additional elements, unless context clearly indicates otherwise. In addition, it will be understood that when one element such as a layer, a film, a region or a plate is referred to as being "on" another element, the one element may be directly on the another element, and one or more intervening elements may also be present. In contrast, when one element such as a layer, a film, a region or a plate is referred to as being "directly on" another element, one or more intervening elements are not present.

Hereinafter, a solar cell and a method for manufacturing the same according to an embodiment of the invention will be described in more detail with reference to the annexed drawings.

FIG. 1 is a sectional view illustrating a solar cell according to an embodiment of the invention.

Referring to FIG. 1, the solar cell 100 according to the embodiment of the invention includes a substrate 110 (for example, a semiconductor substrate, hereinafter, referred to as "semiconductor substrate"), conductive type regions 20 and 30 formed in the semiconductor substrate 110, and electrodes 24 and 34 electrically connected to the conductive type regions 20 and 30. The conductive type regions 20 and 30 may include an emitter region 20 as a first conductive type region and a back electric field region 30 as a second conductive type region and the electrodes 24 and 34 may include a first electrode 24 electrically connected to the emitter region 20 and a second electrode 34 electrically connected to the back electric field region 30. An isolation portion 40 may be formed in an outer part of the back electric field region 30. The solar cell 100 may further include an anti-reflective film 22, a passivation film 32 or the like. This configuration will be described in more detail.

The semiconductor substrate 110 includes a region in which the conductive type regions 20 and 30 are disposed and a base region 10 in which the conductive type regions 20 and 30 are not disposed. The base region 10 may be composed of a crystalline semiconductor including a first conductive type dopant. For example, the base region 10 may be composed of a monocrystalline or polycrystalline semiconductor (for example, a monocrystalline or polycrystalline silicon) including a first conductive type dopant. In particular, the base region 10 may be composed of a monocrystalline semiconductor (for example, a monocrystalline semiconductor wafer, more specifically, semiconductor silicon wafer) including a first conductive type dopant. When the base region 10 is composed of a monocrystalline semiconductor (for example, monocrystalline silicon) as described above, the solar cell 100 is composed of a monocrystalline semiconductor solar cell (for example, a monocrystalline silicon solar cell). The solar cell 100, which is based on the base region 10 or the semiconductor substrate 110 having few defects due to excellent crystallinity, exhibits superior electrical properties.

The first conductive type dopant is for example n-type. That is, the base region 10 may include monocrystalline or polycrystalline silicon doped with a Group V element such as phosphorous (P), arsenic (As), bismuth (Bi) or antimony (Sb).

When the base region 10 including an n-type dopant is used, the emitter region 20 including a p-type dopant is formed on a first surface (hereinafter, referred to as a "front surface") of the semiconductor substrate 110, to constitute a pn junction. When light is emitted to (or incident on) the pn junction, electrons produced by the photoelectric effect are moved to a second surface (hereinafter, referred to as a "back surface") of the semiconductor substrate 110 and are collected by the second electrode 34, while holes are moved to the front surface of the semiconductor substrate 110 and are collected by the first electrode 24. As a result, electrical energy is generated. Holes having a low movement speed are moved to the front surface of the semiconductor substrate 110, rather than the back surface thereof, thereby improving photoelectric conversion efficiency, but the invention is not limited thereto, and the base region 10 and the back electric field region 30 may be a p-type and the emitter region 20 may be an n-type.

The front surface and/or the back surface of the semiconductor substrate 110 is textured so that the surface (or surfaces) has a pyramidal shape or the like with irregularities. When surface roughness is increased due to the irregularities formed on the front or back surface of the semiconductor substrate 10 by texturing, reflection of light incident upon the front or back surface of the semiconductor substrate 110 can be reduced. Accordingly, an amount of light reaching the pn junction formed on the boundary between the semiconductor substrate 110 and the emitter region 20 is increased and light loss is thus minimized.

The emitter region 20 including a second conductive type dopant may be formed on the front surface of the semiconductor substrate 110. In the embodiment of the invention, the emitter region 20 may include, as a second conductive type dopant, a p-type dopant, for example, a Group III element such as boron (B), aluminum (Al), gallium (Ga) or indium (In).

The emitter region 20 according to the embodiment of the invention includes a doping region formed by doping the semiconductor substrate 110 with the second conductive type dopant. As a result, the emitter region 20 may be composed of a crystalline semiconductor including a second conductive type dopant. For example, the emitter region 20 may be composed of a monocrystalline or polycrystalline semiconductor (for example, monocrystalline or polycrystalline silicon) including a second conductive type dopant. In particular, the emitter region 20 may be composed of a monocrystalline semiconductor (for example, monocrystalline semiconductor wafer, more specifically, semiconductor silicon wafer) including a second conductive type dopant. The emitter region 20 constitutes a portion of the semiconductor substrate 110 and the emitter region 20 and the base region 10 have the same crystal structure, thereby improving junction properties, but the invention is not limited thereto and the emitter region 20 may have a different structure from the base region 10.

In the embodiment of the invention, the emitter region 20 may have a homogeneous structure. That is, a doping concentration of the second conductive type dopant is uniform over the entire surface of the emitter region 20, but the invention is not limited thereto and the emitter region 20 may have a selective structure. This structure will be described in detail with reference to FIG. 12 or the like later.

The anti-reflective film 22 and the first electrode 24 are formed on the semiconductor substrate 110, more specifically, on the emitter region 20 formed on the semiconductor substrate 110.

The anti-reflective film 22 may be formed over substantial the entirety of the front surface of the semiconductor substrate 110, excluding a portion corresponding to the first electrode 24. The anti-reflective film 22 reduces reflectivity of light incident upon the front surface of the semiconductor substrate 110 and passivates defects present on the surface or in the bulk of the emitter region 20.

The reduction of reflectivity of light incident upon the front surface of the semiconductor substrate 110 increases an amount of light reaching the pn junction formed at the interface between the semiconductor substrate 110 and the emitter region 20. As a result, the solar cell 100 increases short circuit current (Isc). The defects present in the emitter region 20 are passivated, recombination sites of minority carriers are removed and open-circuit voltage (Voc) of the solar cell 100 is thus increased. As such, the anti-reflective film 22 increases open-circuit voltage and short circuit current of the solar cell 100 and thereby improves efficiency of the solar cell 100.

The anti-oxidation film 22 may be formed of a variety of materials. For example, the anti-reflective film 22 may include a single film including one selected from the group consisting of a silicon nitride film, a silicon nitride film containing hydrogen, a silicon oxide film, a silicon oxide nitride film, an aluminum oxide film, $MgF_2$, ZnS, $TiO_2$ and $CeO_2$ or a multilayer film including a combination of two or more of these films, but the invention is not limited thereto. The anti-reflective film 22 may include a variety of materials. A front surface passivation film may be further provided between the semiconductor substrate 110 and the anti-reflective film 22 and this configuration also falls within the scope of the invention.

The first electrode 24 is electrically connected to the emitter region 20 through an opening formed on the anti-reflective film 22 (that is, the first electrode 24 passes through the anti-reflective film 22). The first electrode 24 may have a variety of shapes using a variety of materials and the shape of the first electrode 24 will be described with reference to FIG. 2 again.

The back electric field region 30 including a first conductive type dopant at a higher doping concentration than the semiconductor substrate 110 is formed on the back surface of the semiconductor substrate 110. In the embodiment of the invention, the back electric field region 30 may include, as a first conductive type dopant, an n-type dopant, for example, a Group V element such as phosphorous (P), arsenic (As), bismuth (Bi) or antimony (Sb).

The back electric field region 30 according to the embodiment of the invention includes a doping region formed by doping the semiconductor substrate 110 with the first conductive type dopant. As a result, the back electric field region 30 may be composed of a crystalline semiconductor which includes the second conductive type dopant at a doping concentration higher than that in the base region 10. For example, the back electric field region 30 may be composed of a monocrystalline or polycrystalline semiconductor (for example, monocrystalline or polycrystalline silicon) including a first conductive type dopant. In particular, the back electric field region 30 may be composed of a monocrystalline semiconductor (for example, monocrystalline semiconductor wafer, more specifically, semiconductor silicon wafer) including a first conductive type dopant. As such, the back electric field region 30 constitutes a portion of the semiconductor substrate 110, and the back electric field region 30 and the base region have the same crystal structure, thereby maximizing properties of the back electric field region 30, but the invention is not limited thereto and the back electric field region 30 may have a different structure from the base region 10.

In this case, in the embodiment of the invention, the back electric field region 30 is formed at a uniform concentration and is spaced from an edge of the semiconductor substrate 110 by a predetermined distance. That is, the isolation portion 40 is formed in a frame shape along the edge of the back electric field region 30. Shapes of the back electric field region 30, the isolation portion 40 or the like will be described in more detail with reference to FIGS. 3 and 4.

The passivation film 32 and the second electrode 34 may be formed on the back surface of the semiconductor substrate 110.

The passivation film 32 may be formed over the substantial entirety of the back surface of the semiconductor substrate 110, excluding a portion corresponding to the second electrode 34. The passivation film 32 passivates defects present on the back surface of the semiconductor substrate 110 and thereby removes recombination sites of minority carriers. As a result, open-circuit voltage (Voc) of the solar cell 100 is increased.

The passivation film 32 may be formed of a transparent and insulating material, allowing for transmission of light. Accordingly, light is incident upon the back surface of the semiconductor substrate 110 through the passivation film 32, thereby improving efficiency of the solar cell 100. That is, the solar cell 100 according to the embodiment of the invention may be a double-sided light-receiving type in which light is incident upon two surfaces.

For example, the passivation film 32 may include a single film including one selected from the group consisting of a silicon nitride film, a silicon nitride film containing hydrogen, a silicon oxide film, a silicon oxide nitride film, an aluminum oxide film, $MgF_2$, ZnS, $TiO_2$ and $CeO_2$ or a multilayer film including a combination of two or more of these films, but the invention is not limited thereto. The passivation film 32 may include a variety of materials.

The second electrode 34 is electrically connected to the back electric field region 30 through an opening formed on the passivation film 32 (that is, the first electrode 24 passes through the passivation film 32). The second electrode 34 may have a variety of shapes.

Figure 2:
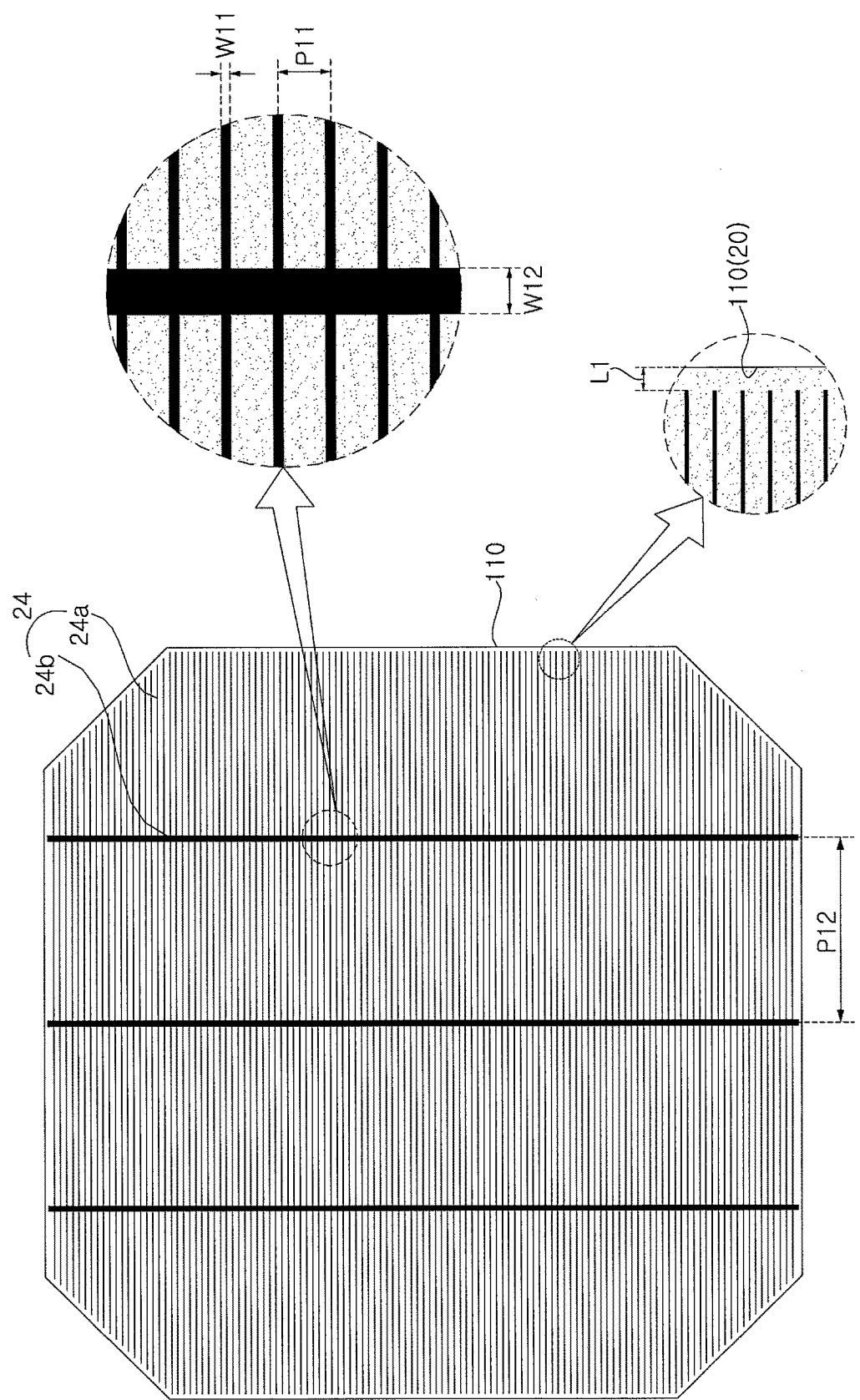
FIG. 2 is a front plan view illustrating the solar cell according to the embodiment of the invention.
Figure 3:
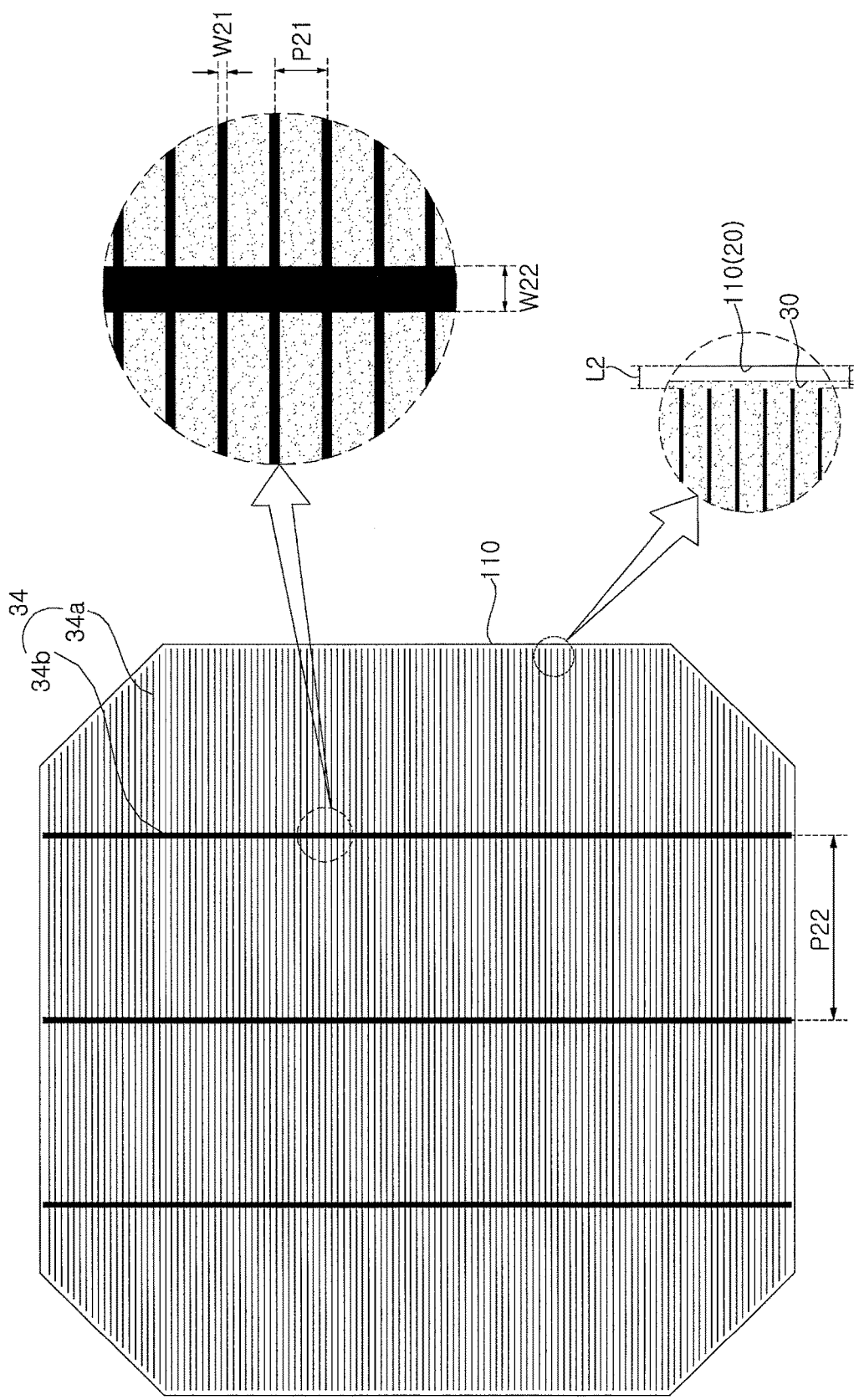
FIG. 3 is a back plan view illustrating the solar cell according to the embodiment of the invention.
Figure 4:
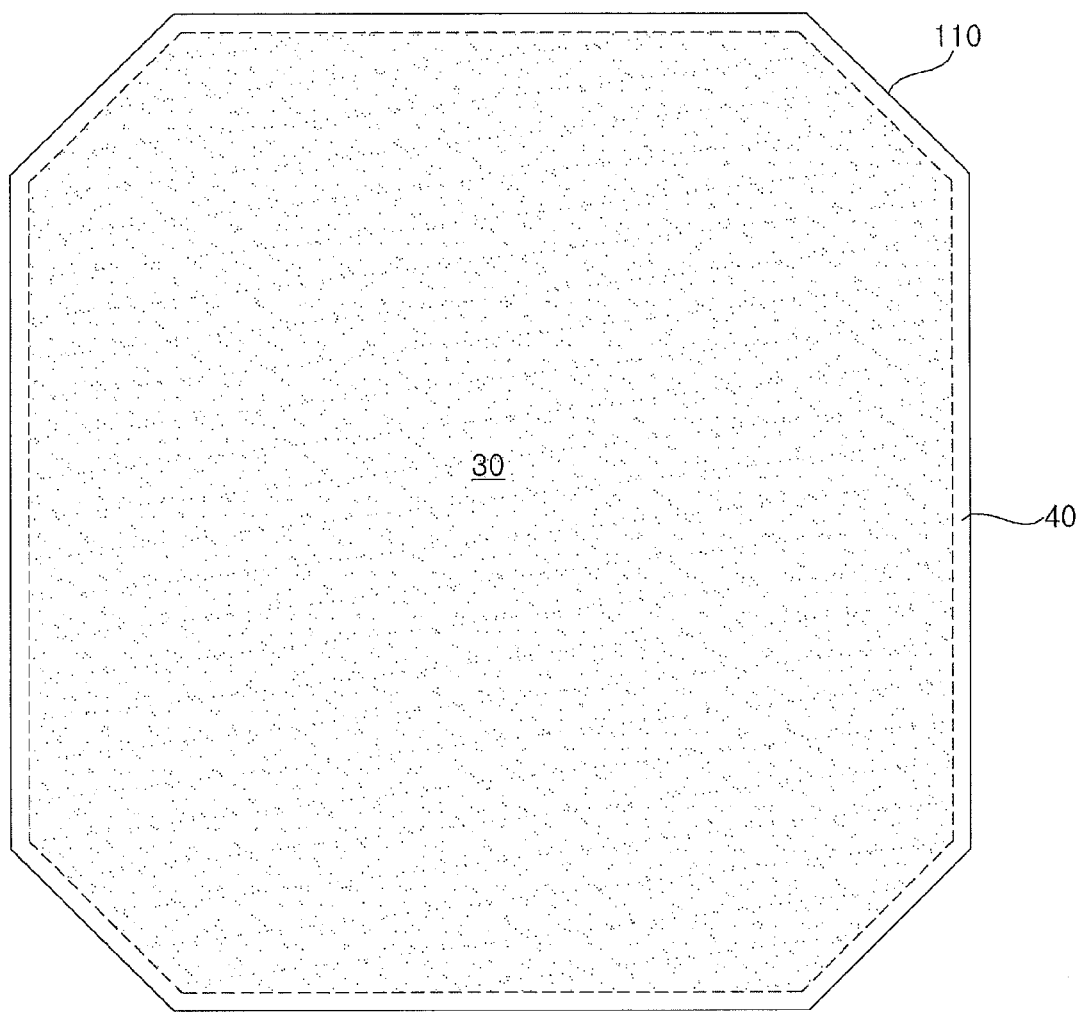
FIG. 4 is a back plan view schematically illustrating a semiconductor substrate and a back electric field region of the solar cell according to the embodiment of the invention.

Hereinafter, an example of plane shapes of the emitter region 20, the back electric field region 30, the first electrode 24 and the second electrode 34 will be described with reference to FIGS. 2 to 4. FIG. 2 is a front plan view illustrating the solar cell according to the embodiment of the invention. FIG. 3 is a back plan view illustrating the solar cell according to the embodiment of the invention, and FIG. 4 is a back plan view schematically illustrating a semiconductor substrate and a back electric field region of the solar cell according to the embodiment of the invention.

Referring to FIG. 2, the first electrode 24 may include a plurality of finger electrodes 24a having a first pitch P11 and being disposed in parallel to one another. The first electrode 24 may include a bus bar electrode 24b which is formed in a direction crossing a direction in which the finger electrodes 24a are disposed and connects the finger electrodes 24a. The bus bar electrode 24b may be one and a plurality of bus bar electrodes including the bus bar electrode 24b, having a second pitch P12 larger than the first pitch P11, may be provided, as shown in FIG. 2. In this case, a width W12 of the bus bar electrode 24b may be greater than a width W11 of the finger electrode 24a, but the invention is not limited thereto and the width W12 of the bus bar electrode 24b may be equal to or smaller than the width W11 of the finger electrode 24a.

When seen from the cross-section of this structure, both the finger electrode 24a and the bus bar electrode 24b may pass through the first anti-reflective film 22. Alternatively, the finger electrode 24a passes through the anti-reflective film 22 and the bus bar electrode 24b is formed on the anti-reflective film 22.

In this case, referring to an enlarged circle shown in a lower part of FIG. 2, the emitter region 20 is entirely formed on the semiconductor substrate 110 such that the edge of the emitter region 20 contacts an edge of the semiconductor substrate 110. In addition, the first electrode 24 is spaced from the edge of the semiconductor substrate 110 by a first distance L1. It is possible to cope with generation of alignment error or the like by spacing the first electrode 24 from the edge of the semiconductor substrate 110. In addition, the first electrode 24 prevents unnecessary electrical connection to a side of the edge of the semiconductor substrate 110. However, when the first distance L1 is excessively great, the first electrode 24 may not efficiently collect carriers formed by photoelectric transformation. In consideration of this aspect, the first distance L1 is for example 0.5 mm to 1.0 mm, but the invention is not limited thereto and the first distance L1 may be variably changed.

As described above, the emitter region 20 is formed over the entire surface of the semiconductor substrate 110, the edge of the emitter region 20 contacts the edge of the semiconductor substrate 110 and the first electrode 24 is spaced from the edge of the semiconductor substrate 110 by a first distance L1. As a result, the first electrode 24 is spaced from the edge of the emitter region 20 by the first distance L1 (for example, 0.5 mm to 1.0 mm).

Referring to FIG. 3, the second electrode 34 may include a plurality of finger electrodes 34a having a third pitch P21 and being disposed in parallel to one another. The second electrode 34 may include a bus bar electrode 34b which is formed in a direction crossing a direction in which the finger electrodes 34a are disposed and connects the finger electrodes 34a. The bus bar electrode 34b may be one, and a plurality of bus bar electrodes including the bus bar electrode 34b, having a fourth pitch P22 larger than the third pitch P21, may be provided, as shown in FIG. 3. In this case, a width W22 of the bus bar electrode 34b may be greater than a width W21 of the finger electrode 34a, but the invention is not limited thereto and the width W22 of the bus bar electrode 34b may be equal to or smaller than the width W21 of the finger electrode 34a. In this case, the third pitch P21, the fourth pitch P22, and the widths W21 and W22 may be the same as or different from the first pitch P11, the second pitch P12, and the widths W11 and W12, respectively.

When seen from the cross-section of this structure, both the finger electrode 34a and the bus bar electrode 34b may pass through the passivation film 32. Alternatively, the finger electrode 34a passes through the passivation film 32 and the bus bar electrode 34b is formed on the passivation film 32.

In this case, referring to the enlarged circle shown in the lower part of FIG. 3, and FIG. 4, as described above, the back electric field region 30 is spaced from the edge of the semiconductor substrate 110 and the isolation portion 40 is formed on the perimeter of the back electric field region 30. That is, the edge of the back electric field region 30 is entirely spaced from the edge of the semiconductor substrate 110 to form a shape such as an island, and the isolation portion 40 is formed along the edge of the back electric field region 30. In the example shown in the drawing, the semiconductor substrate 110 has a substantially octagonal shape, the back electric field region 30 thus also has a substantially octagonal shape and the isolation portion 40 has a substantial octagon ring shape, but the invention is not limited thereto, and the semiconductor substrate 110, the back electric field region 30 and the isolation portion 40 may have a variety of shapes.

For example, a width T1 of the isolation portion 40 may be 0.5 mm to 1.5 mm. When the width T1 of the isolation portion 40 is less than 0.5 mm, isolation effects may be insufficient and when the width T1 exceeds 1.5 mm, a region in which the back electric field region is not formed widens and recombination may be not sufficiently prevented. In this case, to secure a sufficient area of the back electric field region 30, the isolation portion 40 may have a width T1 of 0.5 mm to 1 mm.

In the embodiment of the invention, the isolation portion 40 may be formed by placing a mask on the edge of the semiconductor substrate 110 (represented by reference numeral "112" in FIG. 7, hereinafter, the same will be applied) and forming the back electric field region 30 by ion implantation. The region in which the mask 112 is disposed substantially constitutes the isolation portion and a boundary portion (represented by reference numeral "300" of FIG. 1, hereinafter, the same will be applied) in which a doping concentration or junction depth is changed is disposed in a portion of the edge of the isolation portion 40 adjacent to the back electric field region 30. The boundary portion 300 is formed when some of the dopant is doped in a lower part of the mask 112 or is diffused during thermal treatment in a region in which a boundary of the opening of the mask 112 (represented by reference numeral "113" of FIG. 7, hereinafter, the same will be applied) is disposed. A portion of the back electric field region 30 having a predetermined junction depth and a predetermined doping concentration in the boundary portion 300 is defined as an effective area 302.

In the embodiment of the invention, during formation of the back electric field region 30, the back electric field region 30 and the isolation portion 40 are simultaneously formed using the mask 112. As a result, a process of separately forming the isolation portion 40 is unnecessary and the overall process is thus simplified.

At this time, the isolation portion 40 can be stably formed by forming the back electric field region 30 by ion implantation. This will be described in more detail. A thermal diffusion method wherein the semiconductor substrate 110 is disposed in a high-temperature furnace having a gas atmosphere containing a first conductive type dopant and the first conductive type dopant is diffused has difficulty associated with use of the mask 112 due to high temperature. In addition, although the mask 112 is used, the first conductive type dopant is diffused between the mask 112 and the semiconductor substrate 110, thus making it difficult to form the isolation portion 40 at a uniform width, and the region corresponding to the boundary portion 300 has a great width, and the isolation portion 40 may be actually not be thus formed. In spite of using a method using a doping paste or the like, it is difficult to form the isolation portion 40 at a uniform width, the region corresponding to the boundary portion 300 has a great width and the isolation portion 40 may be thus actually not formed. On the other hand, in accordance with ion implantation, the first conductive type dopant is injected into the semiconductor substrate 110 by application of a predetermined energy and the first conductive type dopant is doped in the semiconductor substrate 110 at a high straightness, as compared to other methods. As a result, the boundary portion 300 is thinly and homogeneously formed and the isolation portion 40 can thus be stably formed at a uniform width.

In this case, the boundary portion 300 is a region in which the doping concentration and/or junction depth is sharply changed as compared to other regions and the boundary portion 300 may be thus defined by doping concentration, junction depth or the like. For example, the doping concentration and/or junction depth is changed linearly (that is, at a predetermined slope) in the boundary portion 300, but the invention is not limited thereto and the doping concentration and/or the junction depth may be changed in various ways.

That is, when a doping concentration of the effective area 302 of the back electric field region 30 is defined as a second concentration and a doping concentration of the semiconductor substrate 110 of the base region 10 is defined as a first concentration, the boundary portion 300 is defined as a region of which concentration changes from a third concentration lower than the second concentration and higher than the first concentration to the second concentration. For example, the third concentration may be $1\times10^{15}/cm^2$, more specifically $1\times10^{15}/cm^2$ to $1\times10^{16}/cm^2$. The reason for this is that the first conductive type dopant may be considered as being further doped when the doping concentration is $1\times10^{15}/cm^2$ or more, because the doping concentration of the base region 10 of the semiconductor substrate 110 is less than $1\times10^{15}/cm^2$, but the invention is not limited to the value defined above and the third concentration may be changed according to the first concentration and the second concentration.

Alternatively, a junction depth of the effective area 302 of the back electric field region 30 is defined as a first depth and the boundary portion 300 is defined as a region in which the junction depth changes from a second depth less than the first depth to the first depth. In this case, for example, the second depth is 0.5 μm or more. For example, the second depth is 1.0 μm to 2.0 μm. The reason for this is that the first conductive type dopant may be considered as being doped, when the junction depth is 0.5 μm or more, but the invention is not limited to the value defined above and the second depth may be changed according to the first depth.

As described above, in the embodiment of the invention, the boundary portion 300 can be formed with a small width because the back electric field region 30 is formed by ion implantation. As a result, the width T2 of the boundary portion 300 is smaller than the width T1 of the isolation portion 40. For example, a ratio of the width T2 of the boundary portion 300 to the width T1 of the isolation portion 40 may be 0.05 to 0.25. When the ratio exceeds 0.25, the width T2 of the boundary portion 300 increases, and a size of the effective area 302 of the back electric field region 30 decreases or the width T1 of the isolation portion 40 is insufficient. The adjustment of the ratio to the level of less than 0.05 with practical skills may be difficult, but the invention is not limited to the value range defined above. Accordingly, the width T1 of the isolation portion 40, the width T2 of the boundary portion 300, the ratio therebetween and the like may be changed.

In addition, the second electrode 34 may be spaced from the edge of the semiconductor substrate 110 by a second distance L2. It is possible to cope with generation of alignment error or the like by spacing the second electrode 34 from the edge of the semiconductor substrate 110. In addition, this is taken into consideration that the back electric field region 30 is spaced from the edge of the semiconductor substrate 110 by the isolation portion 40. However, when the second distance L2 is excessively great, the second electrode 34 may not efficiently collect carriers formed by photoelectric transformation. In consideration of this, the second distance L2 is for example 0.5 mm to 1.0 mm. As such, the second distance L2 may be the same as or similar to the first distance L1, but the invention is not limited thereto and the second distance L2 may be variably changed.

As described above, the back electric field region 30 is spaced from the edge of the semiconductor substrate 110 by a distance corresponding to the width T1 of the isolation portion and the second electrode 34 is spaced from the edge of the semiconductor substrate 110 by the second distance L2. Accordingly, an end of the second electrode 34 contacts an edge of the back electric field region 30 or is spaced from the edge of the back electric field region 30 by a third distance L3 that is less than the first distance L1. For example, the third distance L3 is 0.5 mm or less (that is, 0 mm to 0.5 mm). The reason for this is that the isolation portion 40 is formed on the back surface of the semiconductor substrate 110.

In the embodiment of the invention, to prevent alignment error, unnecessary short-circuit or the like, the isolation portion 40 is formed in a region in which the second electrode 34 is not formed. Accordingly, the isolation portion 40 can be formed without adding an additional region. As a result, the semiconductor substrate 110 can be efficiently used and efficiency of the solar cell 100 can thus be improved.

Through the isolation portion 40, unnecessary short-circuit that may be generated in the emitter region 20 and the back electric field region 30 can be prevented in the process of forming the emitter region 20 or the back electric field region 30. In addition, in the process of forming the back electric field region 30, the isolation portion 40 can be formed by not forming the back electric field region 30 in the edge of the semiconductor substrate 110. As a result, a process of separately forming the isolation portion 40 is unnecessary and the overall process is thus simplified.

Figure 5:
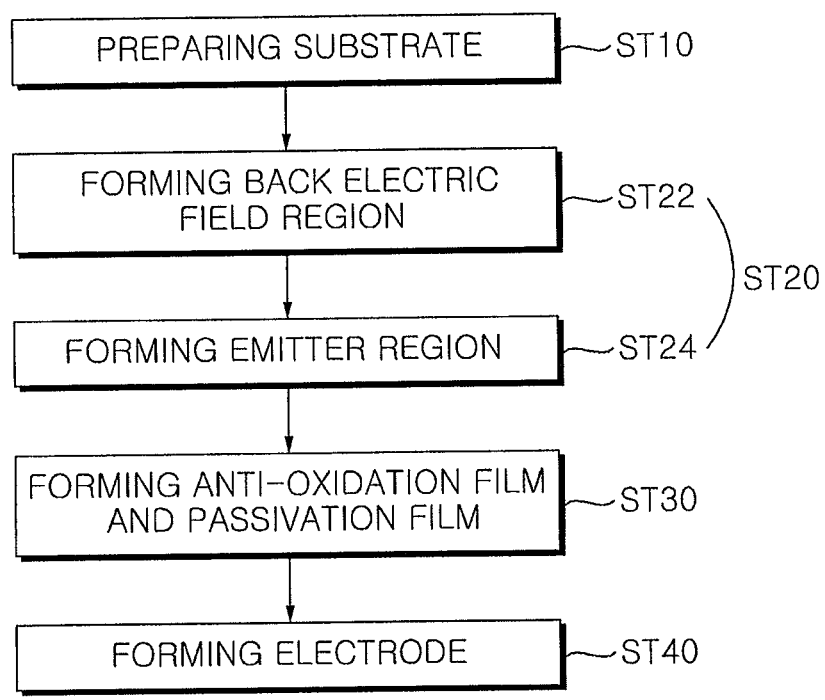
FIG. 5 is a flowchart illustrating a method for manufacturing a solar cell according to an embodiment of the invention.

Such a method for manufacturing the solar cell 100 will be described in more detail with reference to FIG. 5, and FIGS. 6A to 6E. FIG. 5 is a flowchart illustrating a method for manufacturing a solar cell according to an embodiment of the invention and FIGS. 6A to 6E are sectional views illustrating the method for manufacturing the solar cell according to the embodiment of the invention.

Referring to FIG. 5, the method for manufacturing the solar cell according the embodiment of the invention includes preparing a substrate (ST10), forming a conductive type region (ST20), forming an anti-oxidation film and a passivation film (ST30) and forming an electrode (ST40). The forming the conductive type region (ST20) includes forming a back electric field region (ST22) and forming an emitter region (ST24). The respective steps will be described with reference to FIGS. 6A to 6E in detail.

Figure 6A:
FIGS. 6A to 6E are sectional views illustrating the method for manufacturing the solar cell according to the embodiment of the invention.

First, as shown in FIG. 6A, the step of preparing the substrate (ST10) includes preparing a semiconductor substrate 110 including a base region 10 having a first conductive type dopant. In the embodiment of the invention, the semiconductor substrate 110 may include silicon having an n-type dopant. The n-type dopant may be a Group V element such as phosphorous (P), arsenic (As), bismuth (Bi) or antimony (Sb).

At least one of the front and back surfaces of the semiconductor substrate 110 may be textured.

The texturing may be wet or dry texturing. The wet texturing may be carried out by dipping the semiconductor substrate 110 in a texturing solution and has an advantage of short process time. Dry texturing enables formation of uniform irregularities by cutting the surface of the semiconductor substrate 10 using a diamond drill, laser or the like, but disadvantageously has long process time and causes damage to the semiconductor substrate 110. Alternatively, the semiconductor substrate 110 may be textured by reactive ion etching (RIE) or the like. As such, the semiconductor substrate 110 may be textured by a variety of methods.

Figure 6B:
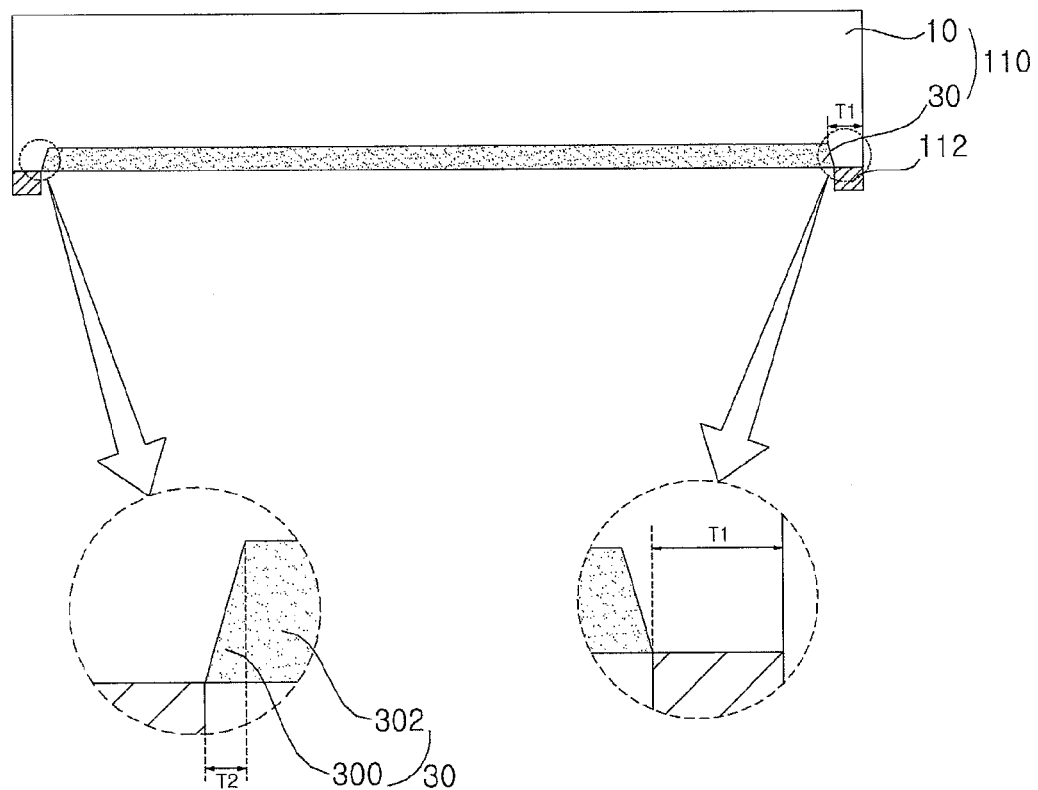
Figure 6C:
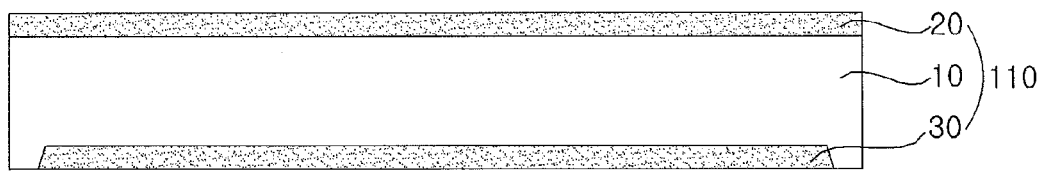

Then, as shown in FIGS. 6B and 6C, the step of forming the conductive type region (ST20) includes an emitter region 20 and a back electric field region 30 as the conductive type regions. More specifically, the back electric field region 30 is formed in the step of forming the back electric field region (ST22), and the emitter region 20 may be formed in the step of forming the emitter region (ST24). In an example shown in the drawings and the description associated therewith, the back electric field region 30 is formed and the emitter region 20 is then formed, but the invention is not limited thereto, and the back electric field region 30 may be formed after the emitter region 20 is formed.

In the step of forming the back electric field region (ST22), as shown in FIG. 6B, a mask 112 (for example, an edge mask) is placed on a surface of the semiconductor substrate 110 and a first conductive type dopant is ion-implanted to form the back electric field region 30. The mask 112 may include a variety of materials and for example includes graphite.

Figure 7:
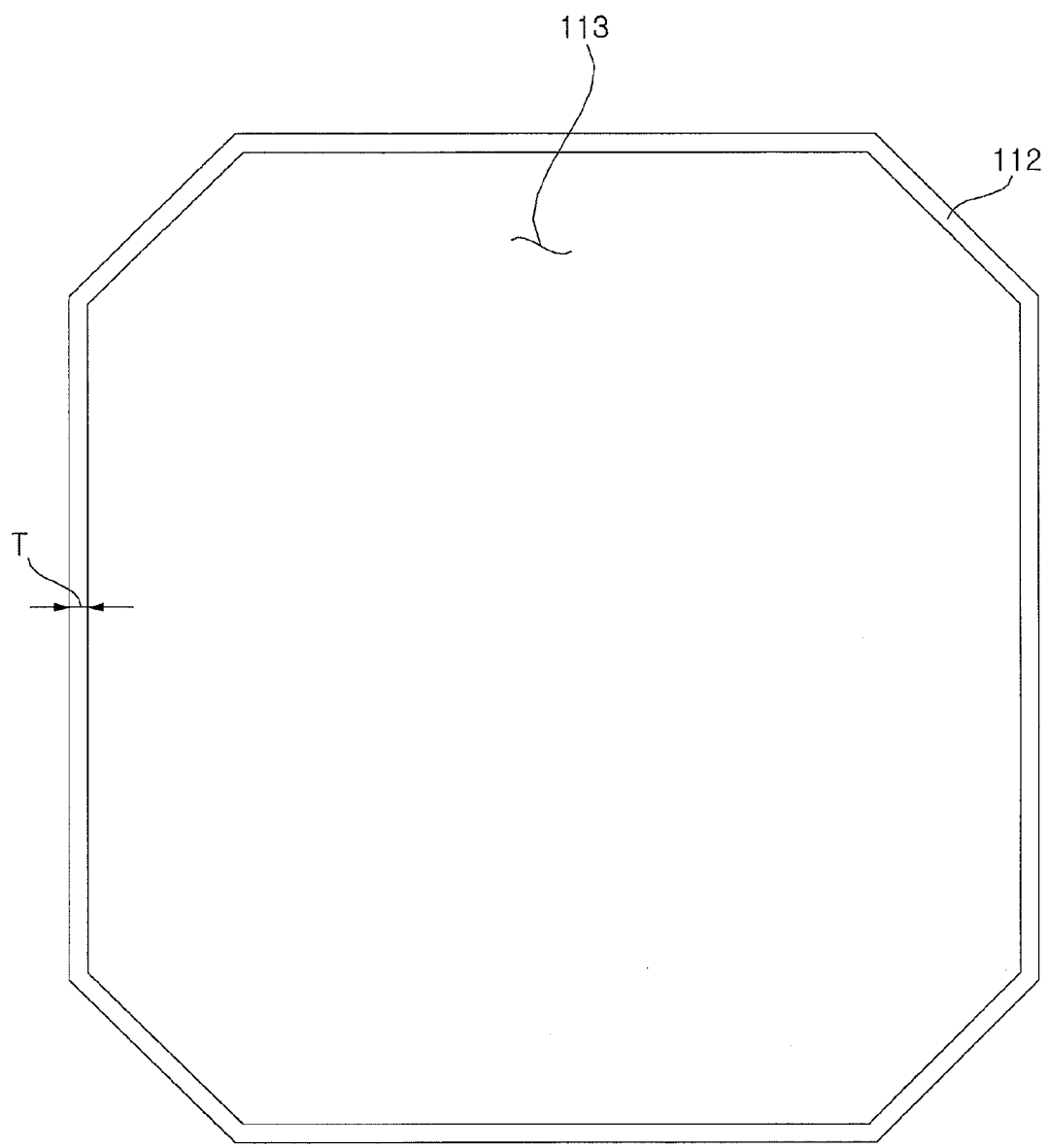
FIG. 7 is a plan view illustrating a mask used for manufacturing the solar cell according to the embodiment of the invention.

The mask 112 will be described in more detail with reference to FIG. 7. FIG. 7 is a plan view illustrating a mask used for manufacturing the solar cell according to the embodiment of the invention.

As shown in FIG. 7, the mask 112 has an opening 113 disposed in the center of the semiconductor substrate 110 and thus has a frame shape formed along the edge of the semiconductor substrate 110. The back electric field region 30 can be formed only in the region corresponding to the opening 113 of the mask 112 by doping the first conductive type dopant while maintaining the position of the mask 112. Ion implantation may be carried out using a variety of well-known devices, processes and the like. For example, plasma is also used upon ion implantation for more efficient doping.

A width T of the edge of the mask 112 may be determined in consideration of the width T1 of the isolation portion (represented by reference numeral "40" of FIG. 6D, hereinafter, the same will be applied). For example, the width T of the edge of the mask 112 is 0.5 mm to 1.5 mm. This is determined as a level enabling formation of the isolation portion 40 with a desired width.

The first conductive type dopant is doped in the semiconductor substrate 110 to form the back electric field region 30. As a result, the back electric field region 30 is not formed in a region in which the mask 112 is disposed and the isolation portion 40 is thus formed along the edge of the back electric field region 30. In this case, the boundary portion 300 is formed at the edge of the back electric field region 30 adjacent to the isolation portion 40 and an effective area 302 is formed in the boundary portion 300. Then, as shown in FIG. 6C, an emitter region 20 is formed on the front surface of the semiconductor substrate 110. For example, the emitter region 20 may be formed by doping the semiconductor substrate 110 with a second conductive type dopant by a variety of methods such as ion implantation and thermal diffusion.

Figure 6D:
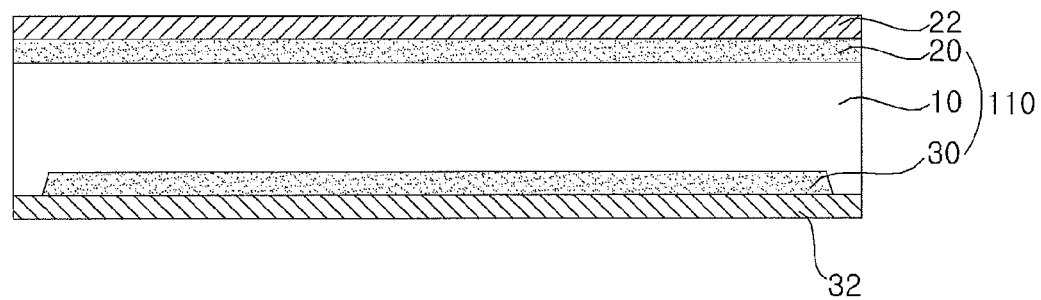

Then, as shown in FIG. 6D, in the step of forming the anti-oxidation film and the passivation film (ST30), the anti-reflective film 22 and the passivation film 32 are formed on the front and back surfaces of the semiconductor substrate 110, respectively.

The anti-reflective film 22 and the passivation film 32 may be formed by a variety of methods such as vacuum deposition, chemical vapor deposition, spin coating, screen printing or spray coating.

Figure 6E:
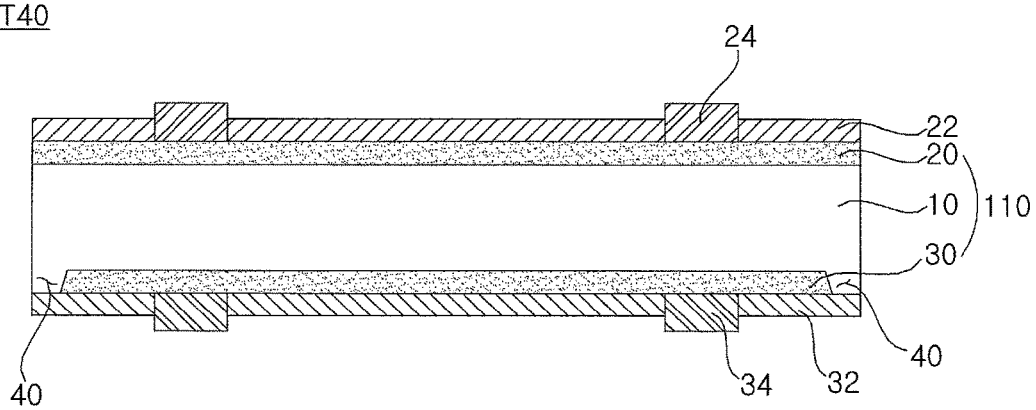

Then, as shown in FIG. 6E, in the step of forming the electrode (ST40), a first electrode 24 contacting the emitter region 20 is formed on the front surface of the semiconductor substrate 110 and a second electrode 34 contacting the back electric field region 30 is formed on the back surface of the semiconductor substrate 110.

An opening is formed in the anti-reflective film 22 and the first electrode 24 is formed in the opening by a variety of methods such as coating or deposition. In addition, an opening is formed in the passivation film 32 and the second electrode 34 is formed in the opening by a variety of methods such as coating or deposition.

Alternatively, a paste for forming the first and second electrodes is applied to the anti-reflective film 22 and the passivation film 32 by screen printing or the like and first and second electrodes 24 and 34 are then formed by fire through or laser firing contact. In this case, a process of separately forming an opening is unnecessary.

In the embodiment of the invention, a back electric field region 30 and an isolation portion 40 are formed using a mask 112. As a result, without adding a further process, the isolation portion 40 may be formed along the edge of the semiconductor substrate 110 during formation of the back electric field region 30. As a result, a further process of isolating the emitter region 20 from the back electric field region 30 is unnecessary, reverse current is prevented, and properties of the solar cell 100 are thus improved. In addition, the back electric field region 30 is formed by ion implantation, thereby enabling formation of the boundary portion 300 to a small thickness and stable and uniform formation of the isolation portion 40. As a result, productivity and efficiency of the solar cell 100 are improved.

In the embodiment of the invention described above, the back electric field region 30 and the emitter region 20 as the conductive type regions are formed, the anti-reflective film 22 and the passivation film 32 are formed and the first and second electrodes 24 and 34 are then formed, but the invention is not limited thereto. Accordingly, a formation order of the emitter region 20, the back electric field region 30, the anti-reflective film 22, the passivation film 32, the first electrode 24 and the second electrode 34 may be variably changed.

In addition, in the embodiment of the invention described above, the back electric field region 30 has a uniform doping concentration on the back surface of the semiconductor substrate 110, excluding the isolation portion 40, and the second electrode 34 has a similar structure to the first electrode 24 to form a double-sided light-receiving solar cell structure, but the invention is not limited thereto and the back electric field region 30 and the second electrode 34 may have different structures. In addition, the structure of the emitter region 20 may be changed. This will be described in detail with reference to FIGS. 8 to 13. A detailed description of the same or extremely similar elements as described above in the following description is omitted and only different elements are described in detail.

Figure 8:
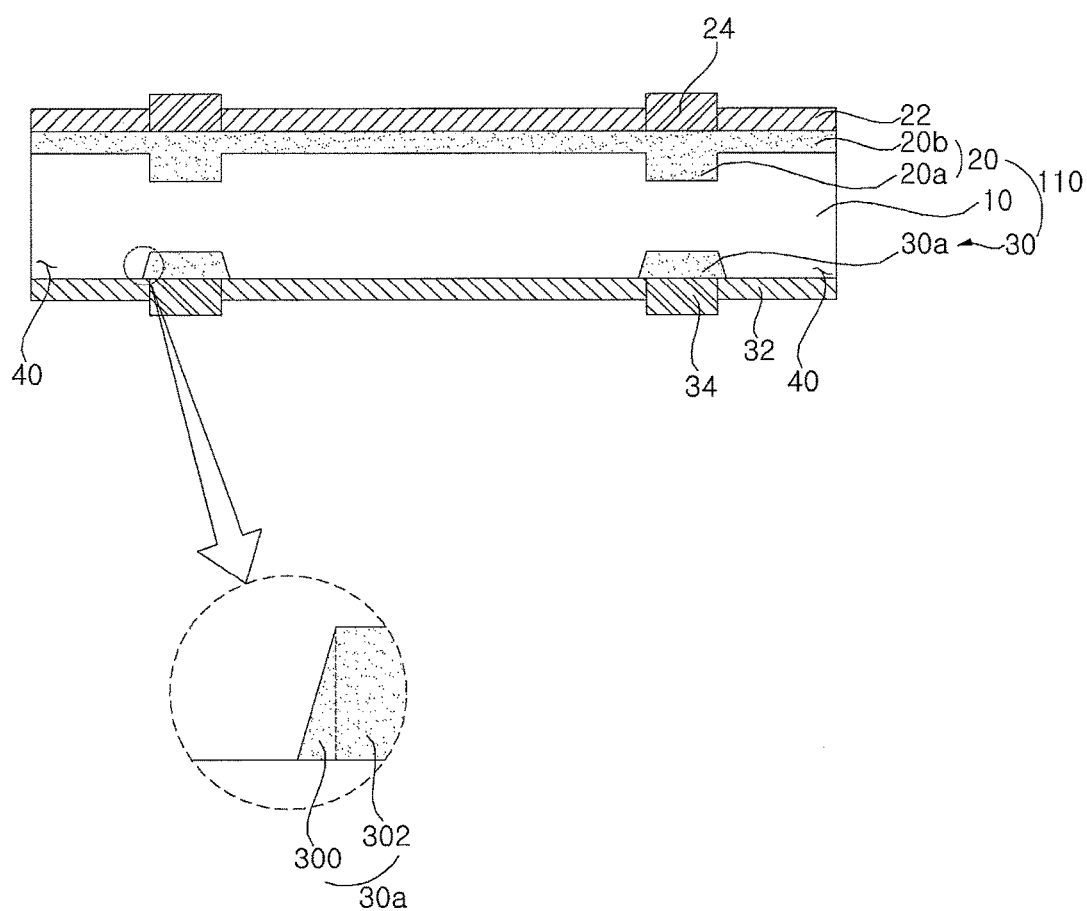
FIG. 8 is a sectional view illustrating a solar cell according to another embodiment of the invention.
Figure 9:
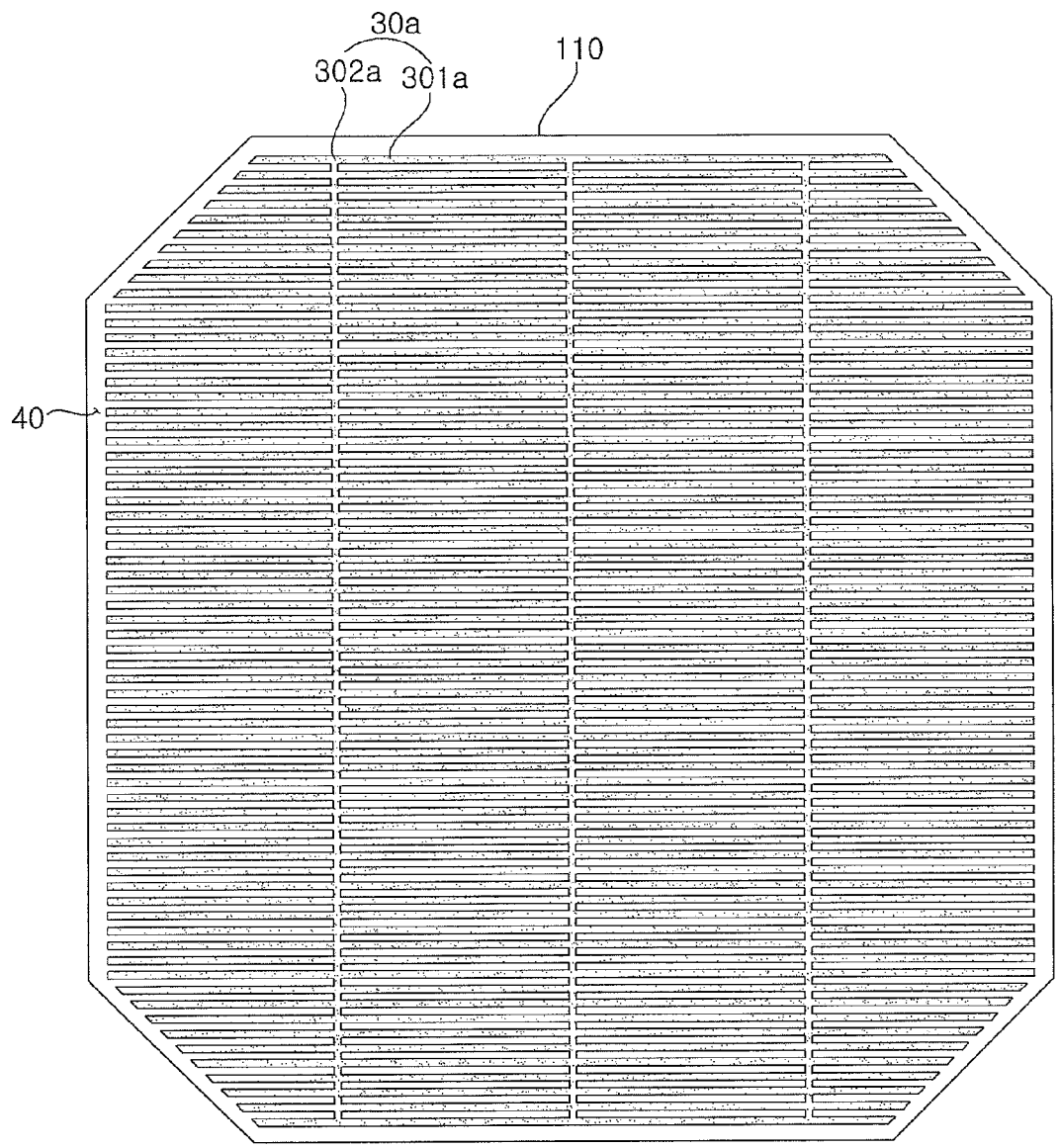
FIG. 9 is a back plan view schematically illustrating a semiconductor substrate and a back electric field region of the solar cell according to the embodiment of the invention.
Figure 10:
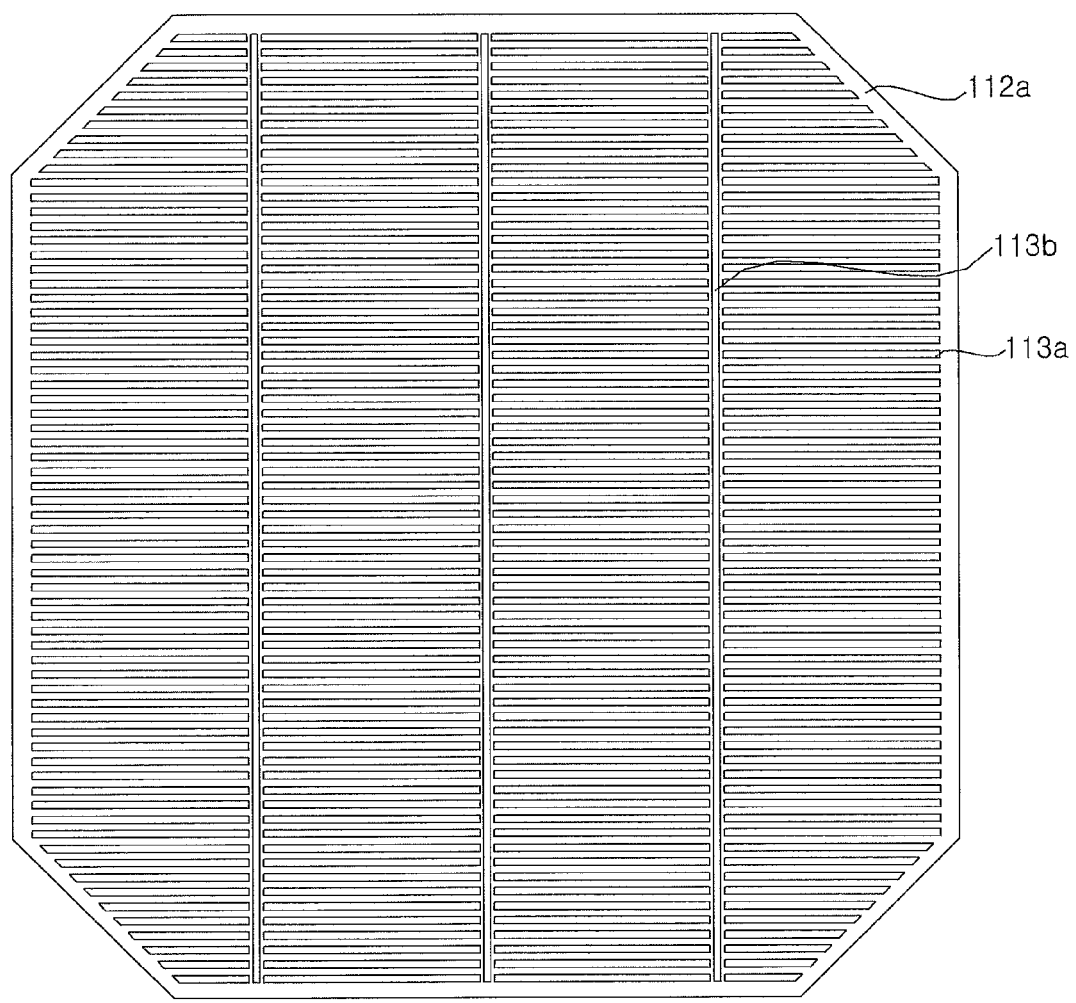
FIG. 10 is a plan view illustrating a mask used for manufacturing the solar cell according to the embodiment of the invention.

FIG. 8 is a sectional view illustrating a solar cell according to another embodiment of the invention. FIG. 9 is a back plan view schematically illustrating a semiconductor substrate and a back electric field region of the solar cell according to the embodiment of the invention. FIG. 10 is a plan view illustrating a mask used for manufacturing the solar cell according to the embodiment of the invention.

Referring to FIGS. 8 and 9, the back electric field region 30 of the solar cell according to the embodiment of the invention may have a local structure. That is, the back electric field region 30 may include only a first portion 30a locally formed only in a region corresponding to at least a part of the second electrode 34. The first portion 30a may include a region 301a corresponding to the finger electrode 34a and a region 302a corresponding to the bus bar electrode 30b, and ends of the first and second regions 301a and 302a adjacent to the edge of the semiconductor substrate 110 are spaced from the edge of the semiconductor substrate 110 via the isolation portion 40. The back electric field region 30 may be formed using the mask 112a shown in FIG. 10 in the same manner as in the step of forming the back electric field region 30 (shown in FIGS. 6B to 6D).

That is, referring to FIG. 10, the mask 112a according to the embodiment of the invention include first and second openings 113a and 113b which are formed to cover a region corresponding to the edge of the semiconductor substrate 110 and expose only a region corresponding to the first portion 30a of the second electrode 34 in the center thereof unlike in FIG. 7. That is, the mask 112a includes the first opening 113a corresponding to the finger electrode 34a and the second opening 113b formed in a direction crossing the finger electrode 34a such that the second opening 113b corresponds to the bus bar electrode 34b. The first opening 113a is spaced from the second opening 113b by a predetermined distance, but doping is performed in a region wider than the first and second openings 113a and 113b when doping is performed using the mask 112a. As a result, the first portion 30a of the back electric field region 30 has a structure in which the region 301a corresponding to the finger electrode 34a is connected to the region 302a corresponding to the bus bar electrode 34a, as shown in FIG. 10.

When the back electric field region 30 is formed using the mask 112a, the isolation portion 40 is naturally formed at the edge of the semiconductor substrate 110 (in particular, between the edge of the first portion 30a and the edge of the semiconductor substrate 110). The width of the isolation portion 40, the width of the boundary portion 300 of the back electric field region 30 and the like are the same as or similar to those of the embodiment of the invention described with reference to FIG. 1 and a detailed explanation thereof is thus omitted.

In this case, in the embodiment of the invention, the emitter region 20 includes a first portion 20a which has a high doping concentration and thus a relatively low resistance and a second portion 20b which has a doping concentration lower than the first portion 20a and thus a relatively high resistance. The first portion 20a contacts a part or the entirety (that is, at least a part) of the first electrode 24.

As such, in the embodiment of the invention, the second portion 20b having a relatively high resistance is formed between the first electrodes 24 upon which light is incident, thereby implementing a shallow emitter. As a result, current density of the solar cell 100 is improved. Further, the first portion 20a having a relatively low resistance is formed adjacent to the first electrode 24, thereby reducing contact resistance with the first electrode 24. That is, the emitter region 20 according to the embodiment of the invention maximizes efficiency of the solar cell 100 owing to the selective emitter structure.

However, the invention is not limited thereto and the emitter region 20 may have a homogeneous emitter structure having a uniform doping concentration, as shown in FIG. 1. The same applies to the following embodiment of the invention described with reference to FIGS. 11 to 13.

Figure 11:
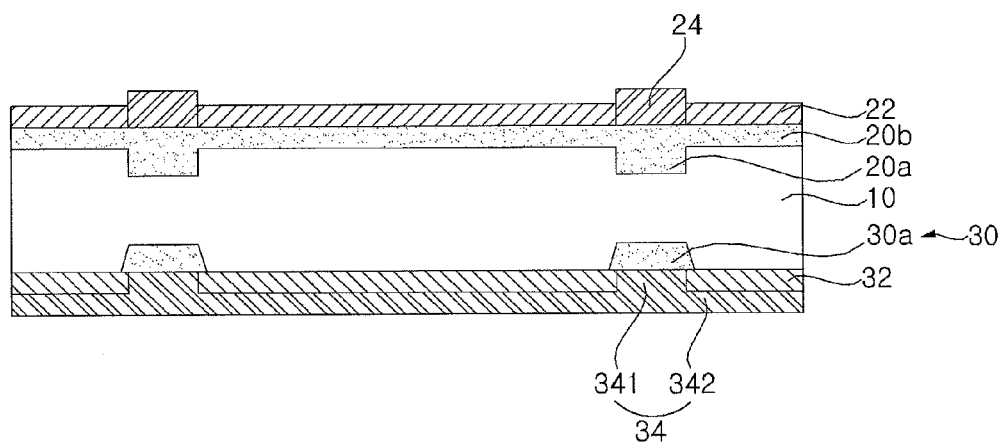
FIG. 11 is a sectional view illustrating a solar cell according to another embodiment of the invention.

FIG. 11 is a sectional view illustrating a solar cell according to another embodiment of the invention.

Referring to FIG. 11, the back electric field region 30 of the solar cell according to the embodiment of the invention has a local structure, and the second electrode 34 is entirely formed on the passivation film 32 and is electrically connected to the first portion 30a of the back electric field region 30 through the opening formed in the passivation film 32. That is, in the embodiment of the invention, the second electrode 34 may include a first electrode portion 341 which passes through the passivation film 32 and is connected to the first portion 30a, and a second electrode portion 342 which is connected to the first electrode portion 341 and is formed over the entire surface of the passivation film 32. In this case, the first electrode portion 341 may point-contact the first portion 30a, but the invention is not limited thereto and the first electrode portion 341 may be connected to the first portion 30a by various contact methods, structures, forms and the like.

In the step forming the second electrode (step shown in FIG. 6E), the second electrode 34 having such a structure may be formed by forming the second electrode portion 342 over the entire surface of the passivation film 32 and melting a region corresponding to the first portion 30a by a method such as laser firing contact to form the first electrode portion 341, but the invention is not limited thereto. The second electrode 34 may be formed by forming an opening in the passivation film 32 and filling the opening with the second electrode 34. Various other methods may be used.

Figure 12:
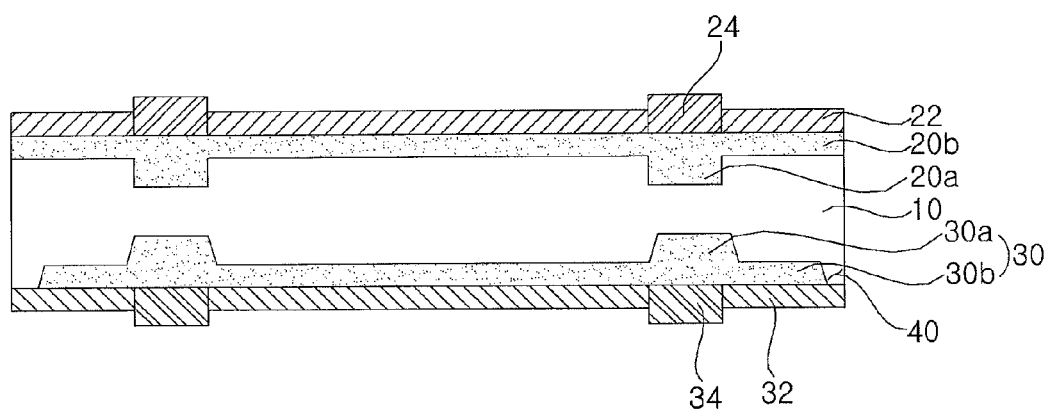
FIG. 12 is a sectional view illustrating a method for manufacturing a solar cell according to the embodiment of the invention.

FIG. 12 is a sectional view illustrating a method for manufacturing a solar cell according to another embodiment of the invention.

Referring to FIG. 12, the back electric field region 30 in the solar cell according to the embodiment of the invention includes a first portion 30a which has a high doping concentration and thus a relatively low resistance and a second portion 30b which has a doping concentration lower than the first portion 30a and thus a relatively high resistance. The first portion 30a contacts a part or the entirety (that is, at least a part) of the second electrode 34. That is, in the embodiment of the invention, the back electric field region 30 may have a selective structure. The width of the isolation portion 40, the width of the boundary layer of the back electric field region 30 (represented by reference numeral "300" in FIG. 1, hereinafter, the same will be applied) and the like are the same as or similar to those of the embodiment of the invention shown in FIG. 1 and a detailed explanation thereof will thus be omitted. In this case, the boundary portion 300 is formed at the edge of the back electric field region 30 adjacent to the isolation portion 40. The boundary 30 may be formed at the edge of the first portion 30a and/or the edge of the second portion 30b.

In the step of forming the back electric field region (step shown in FIG. 6B), the back electric field region 30 having such a structure may be formed by forming a second portion 30b using the mask 112 shown in FIG. 7 covering the edge of the semiconductor substrate 110 and forming a first portion 30a by further doping using the mask 112a shown in FIG. 10. Alternatively, the back electric field region 30 may be formed by doping the first conductive type dopant using a mask wherein the opening ratio of the region corresponding to the first portion 30a is greater than the opening ratio of the region corresponding to the second portion 30b. As a result, a relatively great amount of the first conductive type dopant is doped in the first portion 30a having a relatively high opening ratio and a relatively small amount of the first conductive type dopant is doped in the second portion 30b having a relatively small opening ratio.

Figure 13:
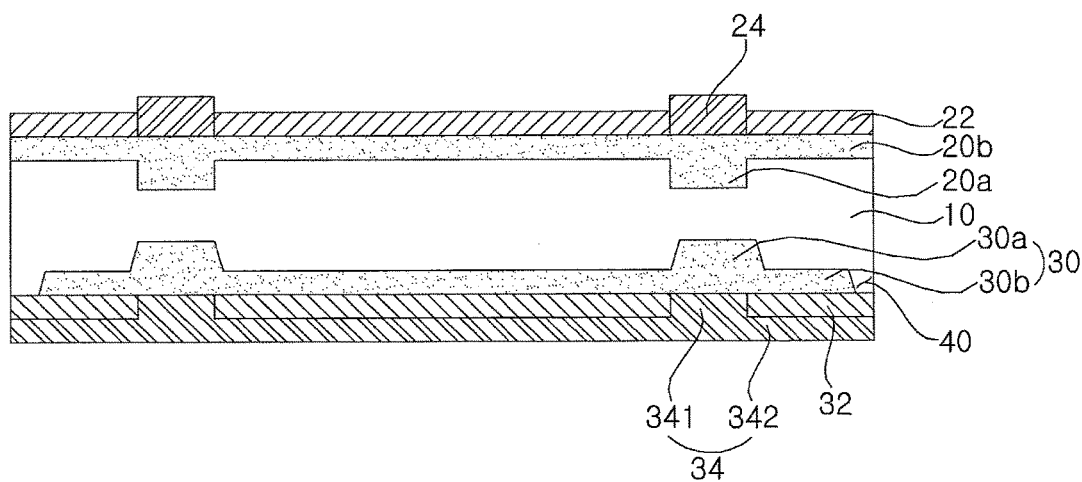
FIG. 13 is a sectional view illustrating a solar cell according to a modified embodiment of the invention.

The second electrode 34 has a double-sided light-receiving solar cell structure in an example shown in FIG. 12, but the invention is not limited thereto. As shown in FIG. 13, the second electrode 34 may include the first electrode portion 341 and the second electrode portion 342. The first and second electrode portions 341 and 342 have been described in the embodiment of the invention shown in FIG. 11 and a detailed explanation thereof will thus be omitted.

Now, the invention will be described in more detail with reference to examples of the invention. The following examples are only provided to illustrate the invention and should not be construed as limiting the scope and spirit of the invention.

EXAMPLE 1

An n-type semiconductor substrate was prepared. A mask having a frame shape covering an edge of the semiconductor substrate was placed on a back surface of the semiconductor substrate and phosphorous (P) was ion-implanted to form a back electric field region and an isolation portion. At this time, a width of the portion of the mask covering the edge of the semiconductor substrate was 0.75 m (750 μm).

At a distance of 0 μm, 325 μm, 700 μm, 800 μm and 950 μm from the edge of the semiconductor substrate in Example 1, a doping concentration and a junction depth were calculated and/or measured. Results are shown in Table 1. In addition, the doping concentration is shown in a graph of FIG. 14 and the junction depth is shown in a graph of FIG. 15.

TABLE 1

| Distance from edge [μm] | Doping concentration [n/cm$^2$] | Junction depth [nm] |
| --- | --- | --- |
| 0 | $6.56 \times 10^{11}$ | 65 |
| 325 | $1.11 \times 10^{14}$ | 907.5 |
| 700 | $2.61 \times 10^{14}$ | 1039 |
| 800 | $5.61 \times 10^{15}$ | 2063 |
| 950 | $5.85 \times 10^{15}$ | 2172 |

Figure 14:
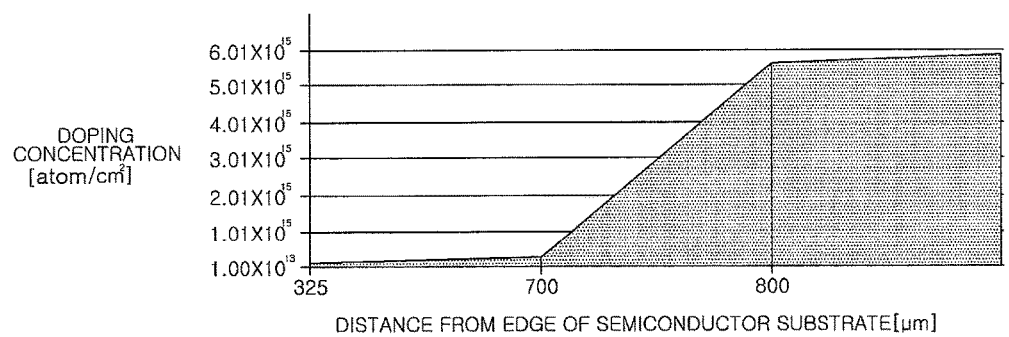
FIG. 14 is a graph showing a doping concentration at 0 μm, 325 μm, 700 μm, 800 μm and 950 μm from an edge of a semiconductor substrate in accordance with Example 1.
Figure 15:
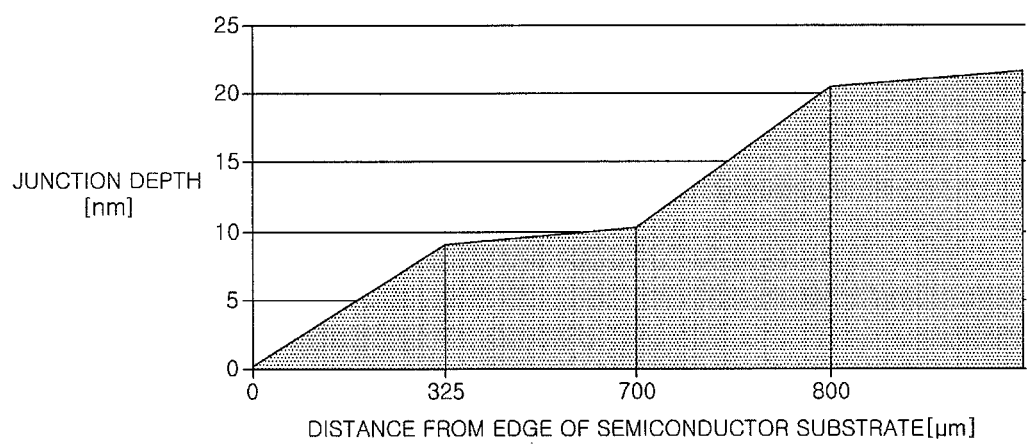
FIG. 15 is a graph showing a junction depth at 0 μm, 325 μm, 700 μm, 800 μm and 950 μm from the edge of a semiconductor substrate in accordance with Example 1.

As can be seen from Table 1 and FIGS. 14 and 15, at a distance of 700 μm to 800 μm from the edge of the semiconductor substrate, the doping concentration is sharply increased to $1 \times 10^{15}$ or more and the junction depth is sharply increased to 1,000 nm or more. That is, it can be seen that the boundary portion is formed at a distance of 700 μm to 800 μm from the edge of the semiconductor substrate using the mask, and the isolation portion is formed at a distance of 700 μm from the edge of the semiconductor substrate. For reference, at a distance of 0 μm to 700 μm from the edge of the semiconductor substrate, the junction depth is measured to have a predetermined value. This is due to the first conductive type dopant (that is, first conductive type dopant doped in the base region) doped in the semiconductor substrate, rather than doping by ion implantation.

As such, in the embodiment of the invention, the isolation portion can be stably formed by forming the boundary to a small thickness of about 100 μm by ion implantation.

Additionally, as seen in FIG. 15, based on an increase of the junction depth relative to a distance from an edge of the semiconductor substrate, slopes of the conductive type regions adjacent to the isolation portion may be obtained.

EXAMPLE 2

An n-type semiconductor substrate was prepared. A mask having a frame shape covering an edge of the semiconductor substrate was placed on a back surface of the semiconductor substrate and phosphorous (P) was ion-implanted to form a back electric field region and an isolation portion. At this time, a width of the portion of the mask covering the edge of the semiconductor substrate was 0.5 mm. In addition, boron (B) was ion-implanted on the front surface of the semiconductor substrate to form an emitter region. An anti-oxidation film and a first electrode were formed on the front surface of the semiconductor substrate, and a passivation film of the semiconductor substrate was formed to manufacture a solar cell.

EXAMPLE 3

A solar cell was manufactured in the same manner as in Example 2, except that the width of the portion of the mask covering the edge of the semiconductor substrate was 1.0 mm.

Reverse current (at −12V) of the solar cells manufactured in accordance with Examples 2 and 3 were measured and results are shown in Table 2.

TABLE 2

| | Reverse current [A] |
| --- | --- |
| Example 2 | 0.62 |
| Example 3 | 1.74 |

As can be seen from Table 2, the solar cells in accordance with Examples 2 and 3 have considerably low reverse currents.

Particular features, structures, or effects described in connection with the embodiment of the invention are included in at least one embodiment of the invention and not necessarily in all embodiments of the invention. Furthermore, the particular features, structures, or effects of any specific embodiment of the invention may be combined in any suitable manner with one or more other embodiments of the invention or may be changed by those skilled in the art to which the embodiments of the invention pertain. Therefore, it is to be understood that contents associated with such combination or change fall within the spirit and scope of the invention Although the embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A solar cell comprising:
a semiconductor substrate with a front surface, a back surface, and an edge connecting the front surface and the back surface;
a first conductive type region formed on substantially the entirety of the front surface of the semiconductor substrate;
a second conductive type region formed on the back surface of the semiconductor substrate, the second conductive type region being spaced from an edge of the semiconductor substrate and having a conductive type different from that of the first conductive type region;
an isolation portion formed at a perimeter of the second conductive type region on the back surface of the semiconductor substrate, wherein the isolation portion has a lower dopant concentration than the second conductive type region;
an anti-reflective film formed over substantially the entirety of the first conductive type region;
a passivation film formed over substantially the entirety of the second conductive type region and the isolation portion;
a first electrode connected to the first conductive type region through the anti-reflective film; and
a second electrode connected to the second conductive type region through the passivation film; wherein the semiconductor substrate comprises a base region in which the first and second conductive type regions are not disposed;
wherein the second conductive type region has a boundary portion in direct contact with the isolation portion, and in which a doping concentration of the boundary portion is changed linearly in relation to a distance from the edge of the semiconductor substrate at a predetermined slope,
wherein the second conductive type region comprises an effective area in direct contact with the boundary portion; wherein a doping concentration of the base region is a first concentration and a doping concentration of the effective area is a second concentration, the doping concentration of the boundary portion changes from a third concentration less than the second concentration and greater than the first concentration to the first concentration, and the third concentration is $1 \times 10^{15}/cm^2$ or more;
wherein a width of the isolation portion is smaller than a distance between the edge of the semiconductor substrate and an end of the second electrode that is closest to the edge of the semiconductor substrate,
wherein the second electrode is connected to the effective area of the second conductive type region,
wherein the second electrode includes:
a plurality of finger electrodes extended in a first direction; and
a plurality of bus bar electrodes extended in a second direction crossing the first direction, and
wherein the second conductive type region includes a first portion corresponding to the plurality of finger electrodes.

2. The solar cell according to claim 1, wherein the width of the boundary portion is smaller than the width of the isolation portion.

3. The solar cell according to claim 1, wherein a ratio of the width of the boundary portion to the width of the isolation portion is 0.05 to 0.25.

4. The solar cell according to claim 1, wherein the third concentration is $1 \times 10^{15}/cm^2$ to $1 \times 10^{16}/cm^2$.

5. The solar cell according to claim 1, wherein the width of the isolation portion is 0.5 mm to 1.5 mm.

6. The solar cell according to claim 5, wherein the width of the isolation portion is 0.5 mm to 1.0 mm.

7. The solar cell according to claim 1, wherein an edge of the first conductive type region contacts the edge of the semiconductor substrate.

8. The solar cell according to claim 1, wherein an edge of the first conductive type region is spaced from an end of the first electrode adjacent thereto by a first distance at the edge of the semiconductor substrate, and
an edge of the second conductive type region contacts the end of the second electrode adjacent thereto, or the edge of the second conductive type region is spaced from the end of the second electrode adjacent thereto by a second distance less than the first distance at the edge of the semiconductor substrate.

9. The solar cell according to claim 1, wherein the first conductive type region is an emitter region, and
the second conductive type region is a back electric field region.

10. The solar cell according to claim 1, wherein the second conductive type region is entirely formed at a uniform doping concentration in a region excluding the boundary portion.

11. The solar cell according to claim 2, wherein the isolation portion is disposed between an edge of the first portion and the edge of the semiconductor substrate.

12. The solar cell according to claim 2, wherein the second conductive type region includes a second portion corresponding to the plurality of bus bar electrodes.

* * * * *